United States Patent [19]

Solie

[11] Patent Number: 4,746,882
[45] Date of Patent: May 24, 1988

[54] SAW MULTIPLEXER USING TAPERED TRANSDUCERS

[75] Inventor: Leland P. Solie, Mahomet, Ill.

[73] Assignee: Unisys Corporation, Blue Bell, Pa.

[21] Appl. No.: 65,760

[22] Filed: Jun. 24, 1987

[51] Int. Cl.[4] ............... H03H 9/145; H03H 9/64
[52] U.S. Cl. ................... 333/196; 324/77 B; 333/154; 333/193; 310/313 B
[58] Field of Search ............... 333/150–155, 333/193–194, 195–196; 310/313 R, 313 B, 313 C, 313 D; 324/77 B, 77 D

[56] References Cited

U.S. PATENT DOCUMENTS

| | | | |
|---|---|---|---|
| 3,568,102 | 3/1971 | Tseng | 333/153 |
| 3,727,718 | 4/1973 | Whitehouse | 333/154 X |
| 3,753,164 | 8/1973 | DeVries | 333/153 |
| 3,975,697 | 8/1976 | Paige | 310/313 D X |
| 4,049,982 | 9/1977 | Cohen | 310/313 B |
| 4,126,800 | 11/1978 | Shiokawa et al. | 333/194 |
| 4,166,228 | 8/1979 | Solie | 310/313 D |
| 4,477,784 | 10/1984 | Maerfeld et al. | 333/154 |
| 4,499,393 | 2/1985 | Stokes et al. | 333/196 |
| 4,521,751 | 6/1985 | Riha et al. | 333/151 |
| 4,633,117 | 12/1986 | Bloch et al. | 310/313 D |
| 4,635,008 | 1/1987 | Solie | 333/195 |

Primary Examiner—Marvin L. Nussbaum
Attorney, Agent, or Firm—Glenn W. Bowen; Laurence J. Marhoefer

[57] ABSTRACT

A simple compact, high performance SAW multiplexer is provided by utilizing an input transducer in which hyperbolic tapered electrode fingers are provided. These hyperbolic electrode fingers provide a low frequency output acoustic wave at locations where the spacing between the fingers is relatively large, and a higher frequency signal at points where the spacing is relatively closer. A series of pickup taps which are preferably located on both sides of the input transducer which are also constructed with hyperbolically tapered fingers, but these pickup elements are separated into segments, and isolated by ground straps so that each pickup finger pad will be responsive only to a portion of the frequencies launched by the input transducer. The frequency of the pickup pads varies from a low frequency to a high frequency in alternate manner from one side of the multiplexer to the other.

5 Claims, 5 Drawing Sheets

SAW MULTIPLEXER USING TAPERED TRANSDUCERS

BACKGROUND OF THE INVENTION

Surface acoustic wave (SAW) applications for signal processing and other requirements often utilize a simple compact high performance SAW multiplier for use in sorting out different frequencies. for example, in receivers in which individual channels overlap on contiguous frequencies, or in data transmission in which case the channels are discrete. While the multiplexer must have good frequency sorting capabilities, it should also have wide bandwidth and low insertion loss. In addition, the device should be easy to construct and implement.

The SAW multiplexer of the present invention is a simple compact, high performance multiplexer by the use configuration using a tapered transducer and matching pickup electrodes. The device of the present invention utilizes a surface transducer of a specially constructed form. The transducer has hyperbolically tapered fingers and is constructed in a manner similar to that shown in U.S. Pat. No. 4,635,008, which was invented by the inventor of the present invention, and is assigned to the assignee of the present invention. U.S. Pat. No. 4,635,008 is hereby incorporated-by-reference into this document.

The transducer of this patent has a number of hyperbolically tapered interdigital fingers which are separated from each other in such a manner that the frequencies launched by the transducer or are received by the transducer, vary from high frequencies at one end of the transducer where the electrode fingers are closely spaced together, to lower frequencies at the opposite end of the transducer where the fingers are more widely separated. The surface acoustical waves that are, therefore, launched by this transducer vary in a like manner as they travel across the surface of the SAW conducting crystal.

BRIEF DESCRIPTION OF THE DRAWING

The present invention is described by reference to the drawings in which.

TECHNICAL DESCRIPTION OF THE INVENTION

Figure 1:
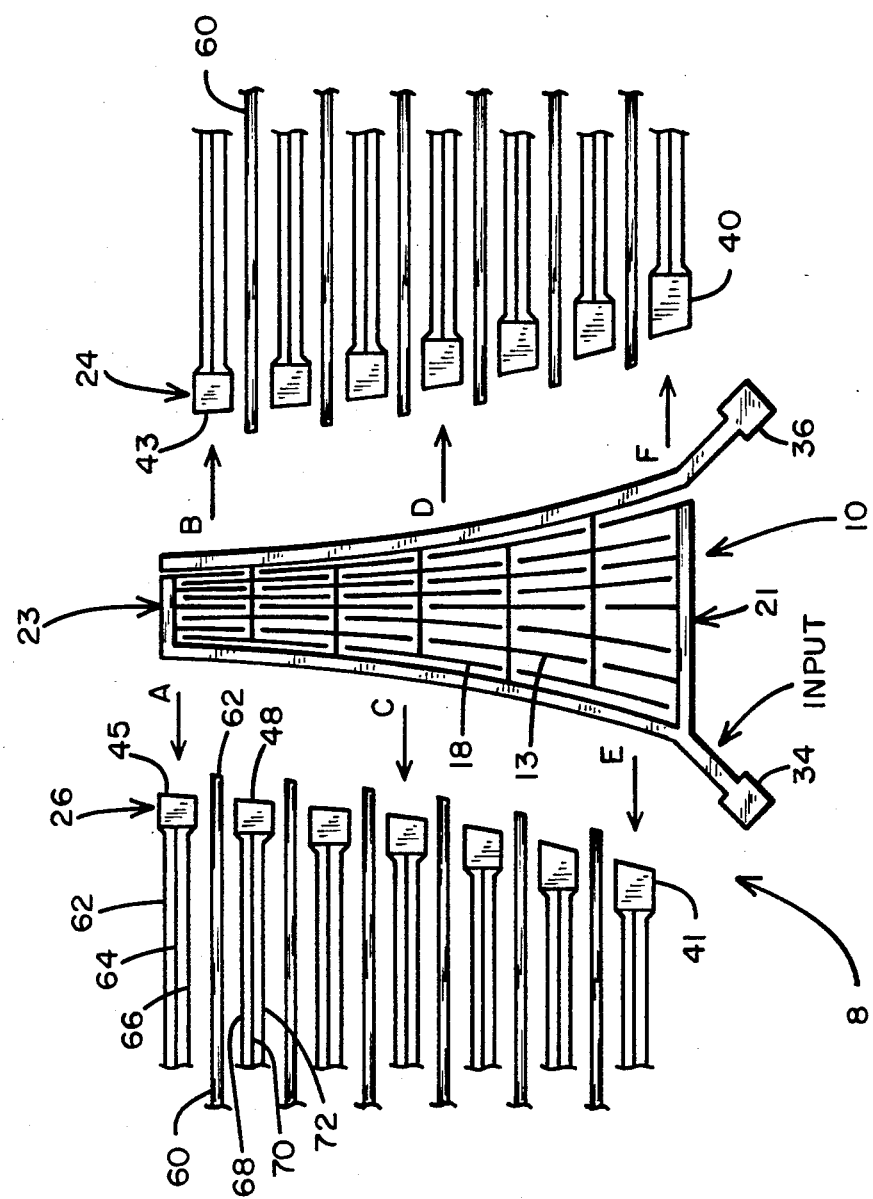
FIG. 1 is a top view of the SAW multiplexer of the present invention.

The present invention is described by reference to FIG. 1 in which the SAW multiplexer 10 employs a hyperbolically tapered transducer 12. FIG. 1 illustrates a SAW multiplexer 8 which is suitable for the present invention. A hyperbolically shaped transducer 10, formed of deposited metallic conductors, is positioned on a surface 13 of a suitable SAW conducting crystal. The transducer 10 is longer at one end 21 than at its opposite end 23. A number of hyperbolically shaped transducer fingers 13 are interdigitized with other hyperbolically shaped transducer fingers 18 are connected to the longer electrode. The fingers 13, 18 are spaced apart so that near the shorter end a high frequency signal will be launched, and near the longer end a lower frequency signal will be transmitted when electrical input signals are coupled across the input pads 34, 36. Thus, along the intermediate portion of the transducer a linear variation of frequency with spacing occurs as one moves from the shorter to the longer electrode. The SAW waves are transported across the surface of the cell toward the pickup elements 24 and 26. The pickup elements 24, 26 are deposited conductors formed on the surface 13, and may be aligned to follow the hyperbolic taper of the transducer to keep the path distance and hence the transmit time of the SAW to each of the pick-up elements constant.

The tapered electrode transducer of the present invention is constructed so that the frequency of the signal launched at a given point is inversely proportional to the distance between the fingers at that location. Thus, nearer to the large end 20 lower frequency waves will be launched, and nearer to the small end 22, higher frequency waves will be generated. The six arrows shown in the figure A-F, represent six individual center frequencies which are selected from the broadband frequencies launched by the transducer.

The arrow A represents the highest frequency SAW which proceeds towards the row of pickup elements 26. The next lower frequency is represented by the arrow B, which proceeds towards the pickup elements 24 on the opposite side of the transducer 10. The lowest frequency is represented in the drawing as that shown by the arrow F while the next lower frequency is shown as proceeding in the opposite direction, by the arrow E.

The pickup element 40 corresponds to a pickup transducer which is designed to pick up a narrowband frequency centered around the frequency represented by the arrow F. In a corresponding manner, the pickup element 41 corresponds to the center frequency represented by the arrow E, while the pickup element 43 corresponds to the frequency represented by the arrow B, and the pick up element 45 corresponds to the frequency represented by the arrow A. The relatively wide conductive strips 60 on both sides of each pickup element act as ground isolation lines, which isolate one pickup element from its neighbor. For example, the pickup element 45 is isolated from the pickup element 48 by such a line.

Figure 2:
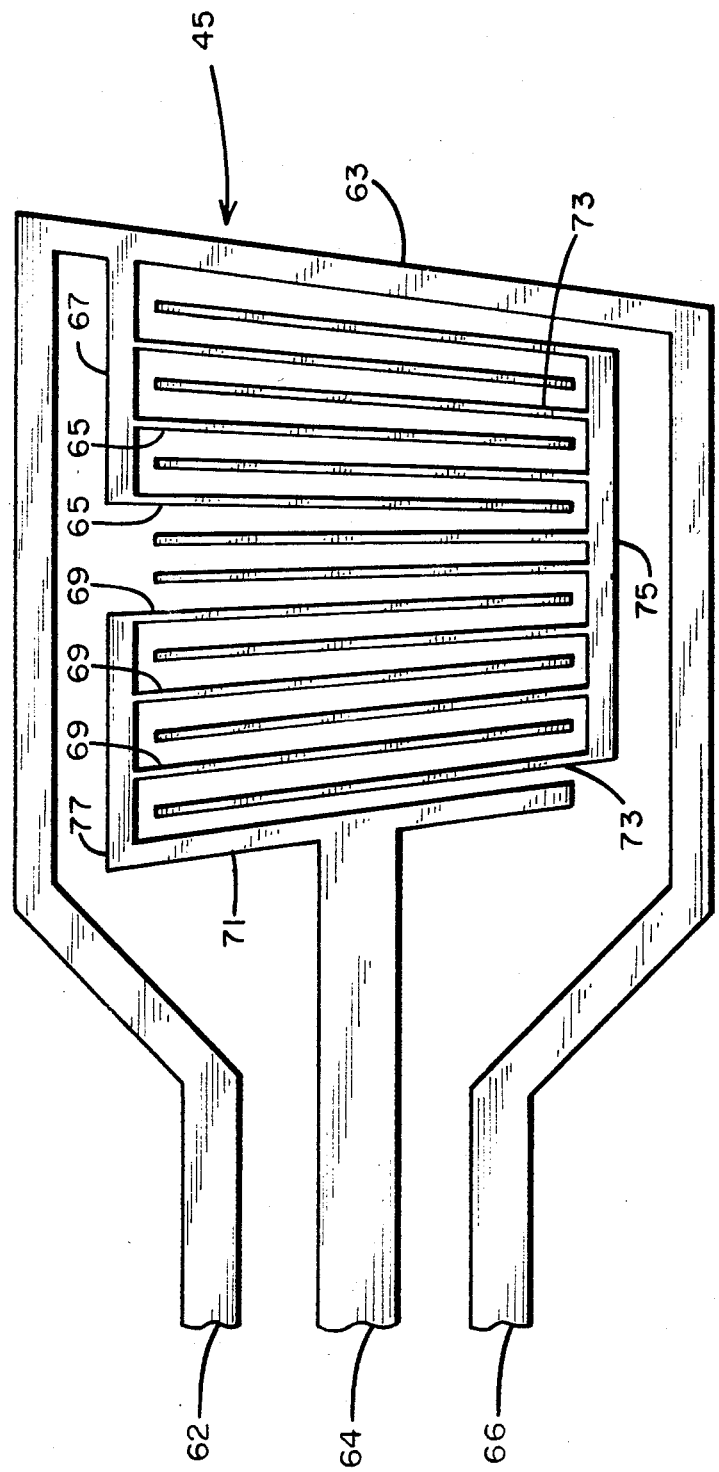
FIG. 2 is a partial enlarged showing of pickup element 45.

Proceeding away from the pickup elements, the interconnecting lines, such as the lines 62, 64 and 66 for the pickup element 45, may diverge away from the interconnecting lines 68, 70 and 72, if desired, to provide more space to make connection to them. The center lines of the interconnecting lines, such as the lines 64 and 70, are all connected to a common ground point, while the outside lines, such as the lines 62, 66 and 68, 72 are utilized to carry the output signals. The lines 62 and 66 are joined by the conductive line 63, as shown in FIG. 2.

One set of interdigital fingers 65 extend from the branch line 67. Another set of fingers 69 extend from the branch line 71. A floating set of fingers that are spaced between the fingers 65 and 69 extend from the connecting line 75. All of the other pickup elements are constructed in a similar manner, but are dimensioned to correspond with the launched frequency range of the transducer 10 in the vicinity of each particular pick-up element. The fingers 65, 69 and 73 are all preferably hyperbolically tapered with the spacing between the fingers increasing progressing from the connecting line 75 toward the sections 77 of the branch line and the branch line 67. The branch lines 65 and 71 and the connecting line 75 are preferably appreciably wider than the fingers 65, 69 and 73 to reduce resistance and loss in the pickup element.

Figure 3:
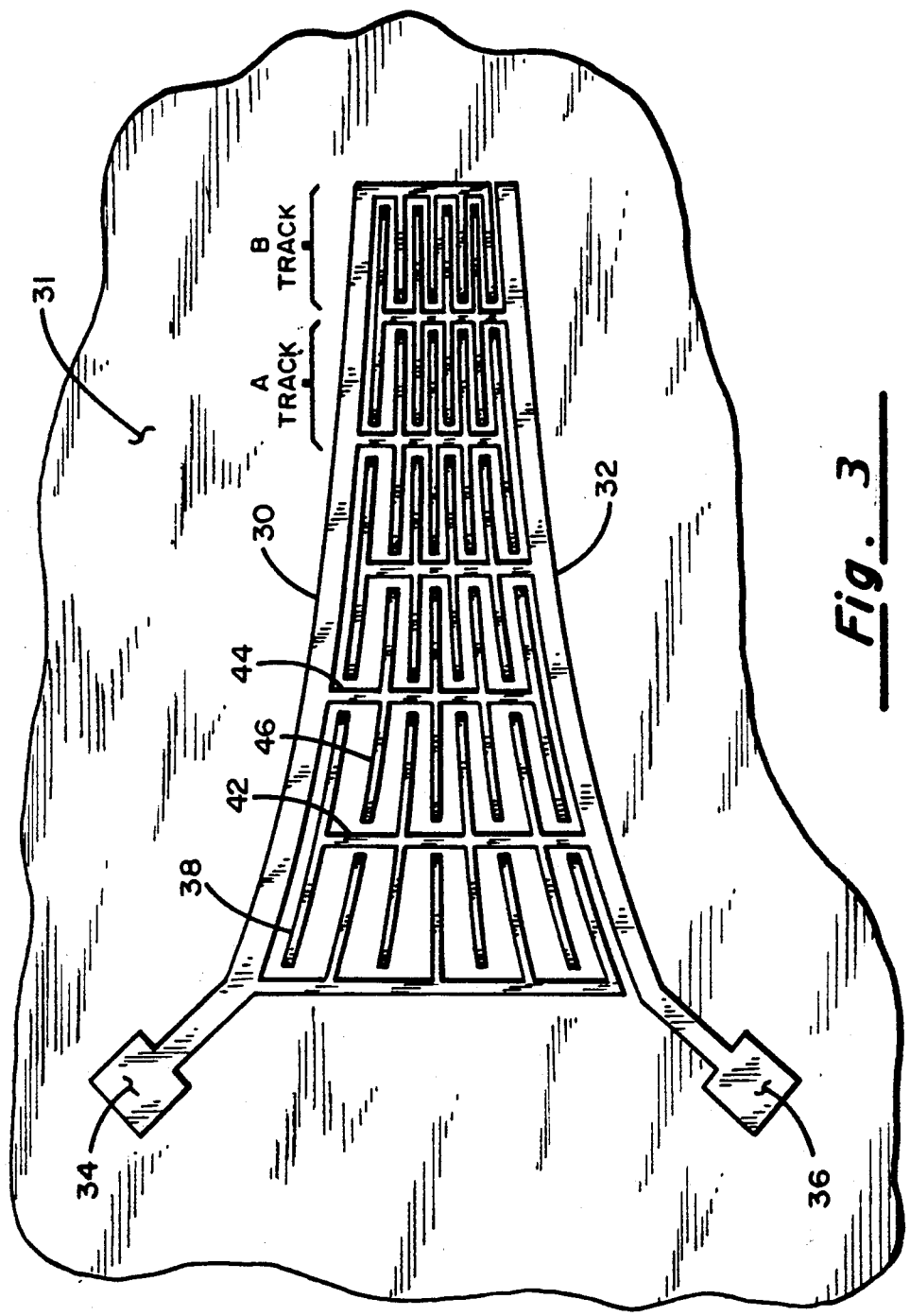
FIG. 3 is a more detailed showing of the transducer of FIG. 1.

The transducer of the present invention in operation, therefore, provides an input transducer which develops a wideband of frequencies, and the launched frequencies are picked up by a plurality of frequency isolated pickup elements. For example, in the embodiment shown in the figure, there are 14 pickup elements which are responsive to separate center frequencies and a small band of frequencies around the center frequency which may provide individually and selectively isolated output signals. The multiplexer of the present invention is constructed in this manner and has a wider bandwidth and a capability of lower insertion loss than prior SAW multiplexing devices. It is simpler and more compact than conventional SAW multiplexers FIG. 3 shows in greater detail the input transducer of FIG. 1. The design of this transducer reduces the insertion loss of a simple hyperbolic transducer of the type shown in FIG. 5, which may also be used in the present invention, as it has its elements numbered in a similar manner to those of the transducer of FIG. 1. This modification involves the segmenting of the fingers of the transducer so that only the two outer, widened electrode fingers 30 and 32, (on a suitable substrate 31, such as a piezoelectric acoustic-wave-propagating medium, or other substrate known to be suitable for the purpose) connect to the opposite electrode pads 34 and 36 respectively, and extend along the entire length of the transducer. The remaining inner electrodes, such as the electrodes 38 and 46, extend along only a portion of the outer fingers 30 and 32, and are connected to their respective outer fingers through the inner electrode segments, and by increasing the width of the outer electrodes 30 and 32, a decrease in electrode resistance is obtained which allows the width of the inner electrodes to be sufficiently narrow to produce a transducer which does not have substantially different acoustic impedance than the transducer of FIG. 5. The electrical parasitic resistance, however, is approximately decreased by $N^2$ over the transducer of FIG. 5, where N is the number of segments, such as the electrode 38 into which each finger electrode is divided. For example, in the embodiment shown in FIG. 4 where there are six segments, the electrode resistance will be approximately 1/36 of the resistance of the transducer shown in FIG. 5.

Figure 4:
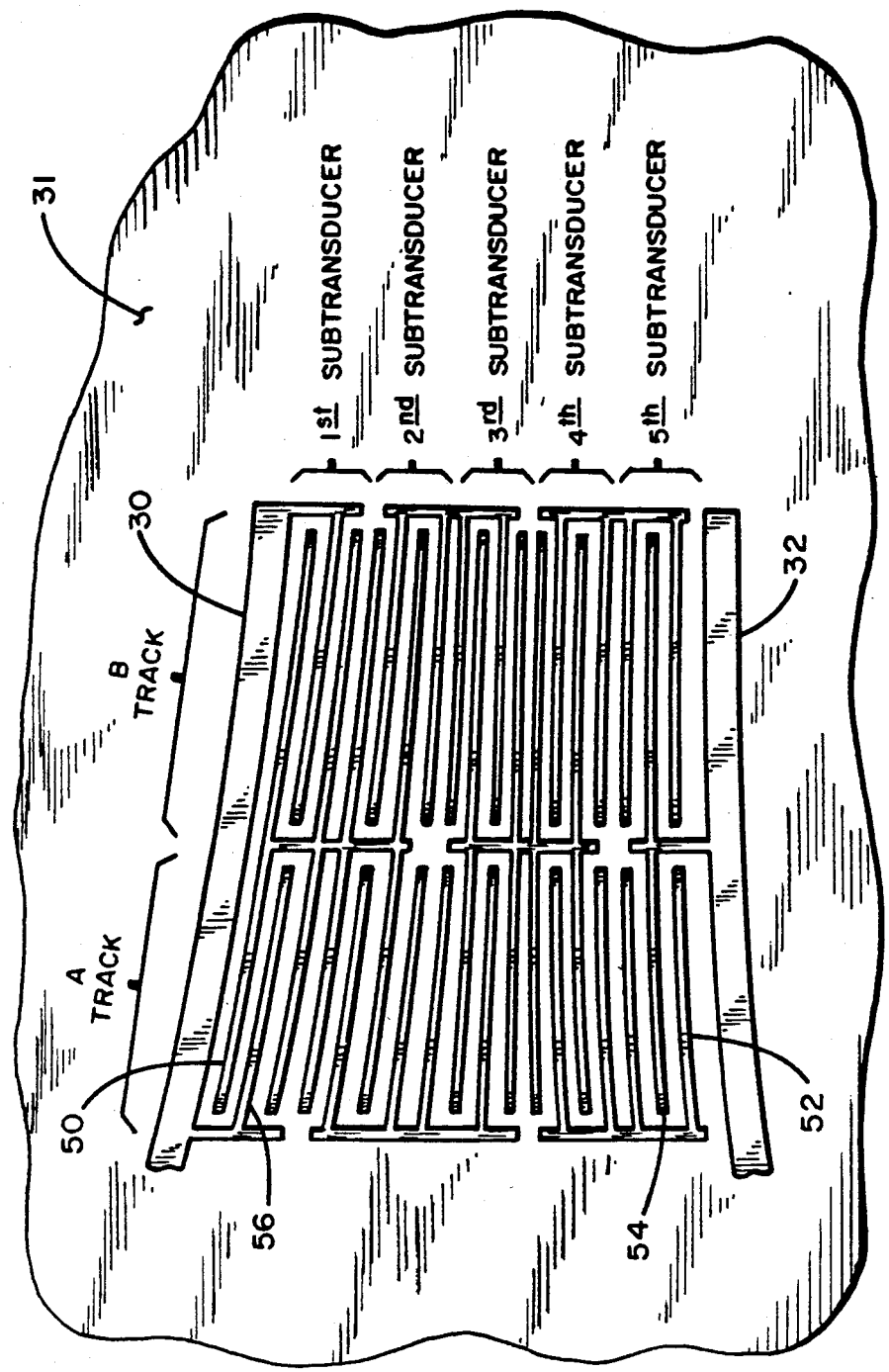
FIG. 4 is a top view of another alternate version of a transducer that may be used in the device.
Figure 5:
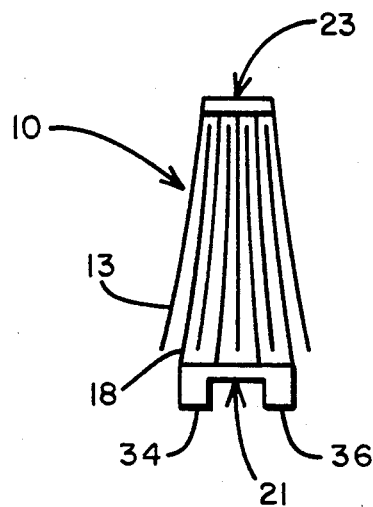
FIG. 5 is a top view of a simple hyperbolically shaped transducer which may be used in the present invention in place of the transducer of FIG. 1.

FIG. 4 shows another modification in which each segment of the transducer may be subdivided to provide a number of subtransducers across the outer electrodes. The showing of FIG. 4, for simplification, illustrates only two tracks of the transducer, which correspond to the tracks between the lines A and B of FIG. 3. Interconnections in these tracks provide a number of capacitively coupled, floating electrode subtransducers. For example, in FIG. 4 there are five subtransducers in each track which are connected in series to provide a voltage dividing path between the electrodes 30, 32. For example, capacitive coupling occurs between sections 30 and 50, 32 and 52, 52 and 54, 50 and 56, etc., of FIG. 4. By using the electrodes of the transducer of FIG. 5, the acoustic impedance is increased by factor $N^2$, where N is the number of subtransducers of each track, over the acoustic impedance of the transducer of FIG. 1. Thus, in the illustrated embodiment of FIG. 4, the acoustic impedance is increased by a factor of 25, as compared to a transducer with the same number of electrodes but with only one subtransducer per segment as in FIG. 1.

Hyperbolically tapered transducers are preferred for use in the present invention and, as described above, since conventional parallel straight line transducer fingers will not provide a wideband response. A Bragg cell modulation may be implemented, however, with transducers and reflectors which have curved fingers which are not hyperbolically tapered, but which may approximate a flatter frequency response than can be obtained with conventional configurations. An example of the construction of transducers with curved fingers is shown in the article entitled "Improved Modeling of Wideband Linear Phase SAW Filters Using Transducers with curved Fingers" by N. J. Slater and C. K. Campbell, which was published in IEEE Transactions on Sonics and Ultrasonics, Vol. SU-31, No. 1, January 1984, pages 46–50. If such a configuration is substituted for the hyperbolically tapered fingers of the elements of the preferred embodiment, however, there will be some compromise in bandwidth.

A transducer with straight-slanted fingers is described in the article "Wideband Linear SAW Filters Using Apodized Slanted Finger Transducers" by P. M. Naraine and C. K. Campbell in IEEE Ultrasonics Symposium Proceedings, 1983, pages 113-116. The slanted finger to digital transducer structure described in this article employed straight-slanted fingers which emanated from a common focal point in an effort to yield flat amplitude response across a passband. Apodization of the device was derived from a computer optimization routine to compensate for the inherent negative amplitude slope of an unapodized slanted finger transducer so that external amplitude equalization circuits were not needed. In this configuration, however, an even greater sacrifice of bandwidth will occur, although the construction of the transducer is somewhat simpler. The reflective elements then would also be slanted, straight elements.

What is claimed is:

1. A SAW multiplexing device comprising
a substrate suitable for conducting surface acoustical waves (SAWs),
transducer means formed of interdigital, electrode fingers located on said substrate for launching a plurality of SAW components, each of which comprise a predetermined center frequency and a band of frequencies about said center frequency, and each of which along its own predetermined path on said substrate wherein said fingers exhibit a variable separation along the length of said transducer means, and
a plurality of pickup means each disposed on said surface so as to receive one of said SAW components, wherein said pickup means are each constructed to be selectively responsive to the center frequency and the band of frequencies around said center frequency of an associated one of said SAW components, and said center frequency and said band of frequency are determined by the spacing dimensions of said fingers of said transducer means at a predetermined portion of said transducer means, and wherein said interdigital electrode fingers are each formed as segments of hyperbolic curves positioned such that the spacing between said fingers varies from point-to-point along said transducer means and the spacing between said fingers is substantially constant at any given point, and said electrode fingers comprise a pair of outer electrode fingers and a plurality of inner electrode fingers, said outer electrode fingers are relatively wider than said inner electrode fingers, said inner electrode fingers are subdivided into a plurality of hyperbolically curved sections, and said transducer means comprises interconnection electrode connection means for connecting each of said sections to one of said outer electrode fingers.

2. A SAW multiplexer as claimed in claim 1 wherein said transducer means is divided into a plurality of tracks, and each of said tracks is subdivided into a plurality of subtransducer elements which comprise floating electrode fingers which are not connected to either of said outer electrode fingers but which are configurated so they capacitively couple subtransducers that are a given track in electrical series.

3. A SAW multiplexer as claimed in claim 1 wherein said pickup means are disposed on both sides of said transducer means.

4. A SAW multiplexer device as claimed in claim 3 wherein said pickup elements are isolated by intervening ground lines.

5. A SAW multiplexer as claimed in claim 3 wherein said transducer means is divided into a plurality of tracks, and each of said tracks is subdivided into a plurality of subtransducer elements which comprise floating electrode fingers which are not connected to either of said outer electrode fingers but which are configurated so they capacitively couple subtransducers that are a given track in electrical series.

* * * * *